(12) United States Patent
Bierweiler et al.

(10) Patent No.: US 10,481,581 B2
(45) Date of Patent: Nov. 19, 2019

(54) DIAGNOSIS FACILITY AND DIAGNOSTIC METHOD FOR MONITORING PERFORMANCE OF A TECHNICAL PLANT

(71) Applicant: Siemens Aktiengesellschaft, Munich (DE)

(72) Inventors: Thomas Bierweiler, Karlsruhe (DE); Daniel Labisch, Karlsruhe (DE)

(73) Assignee: Siemens Aktiengesellschaft, Munich (DE)

(*) Notice: Subject to any disclaimer, the term of this patent is extended or adjusted under 35 U.S.C. 154(b) by 285 days.

(21) Appl. No.: 15/482,997

(22) Filed: Apr. 10, 2017

(65) Prior Publication Data

US 2017/0308056 A1    Oct. 26, 2017

(30) Foreign Application Priority Data

Apr. 12, 2016  (EP) .................................. 16164829

(51) Int. Cl.
*G05B 19/4063*    (2006.01)
*G05B 19/042*    (2006.01)
(Continued)

(52) U.S. Cl.
CPC ..... *G05B 19/4063* (2013.01); *G05B 19/0425* (2013.01); *G05B 19/41805* (2013.01); *G05B 23/024* (2013.01); *G06F 17/5031* (2013.01)

(58) Field of Classification Search
CPC ............ G05B 19/4063; G05B 19/0425; G05B 19/41805; G05B 23/024; G06F 17/5031
See application file for complete search history.

(56) References Cited

U.S. PATENT DOCUMENTS

2004/0153819 A1   8/2004   Bjorsne et al.
2007/0244841 A1   10/2007  Vatchkov et al.
(Continued)

FOREIGN PATENT DOCUMENTS

CN       1490630      4/2004
CN       101027617    8/2007
(Continued)

OTHER PUBLICATIONS

"Monitoring of Complex Industrial Processes based on Self-Organising Maps and Watershed Transformations", Christian W. Frey www.iosb.fraunhofer.de/servlet/is/22544/Paper_ICIT2012_Frey.pdf, found on Mar. 11, 2016.

*Primary Examiner* — Manuel L Barbee
(74) *Attorney, Agent, or Firm* — Cozen O'Connor

(57) ABSTRACT

A diagnosis facility and diagnostic method for monitoring the performance of a technical plant with an automation system. In the performance of a plant with step sequences that run repeatedly, deviations of the time response in a cycle of the step sequence that is to be checked from the time response for fault-free cycles are detected and displayed by evaluation of the data set, using the self-organizing map. To this end, the durations of the execution of each step in the step sequence that is to be checked are determined and evaluated using a predetermined self-organizing map that has been learned using fault-free cycles. This type of evaluation has the advantage that the self-organizing map can be learned automatically and consequently hardly any knowledge of the respective process that is running on the plant is required for the diagnosis.

11 Claims, 4 Drawing Sheets

(51) Int. Cl.
*G05B 19/418* (2006.01)
*G06F 17/50* (2006.01)
*G05B 23/02* (2006.01)

(56) References Cited

U.S. PATENT DOCUMENTS

2008/0189008 A1* 8/2008 Iwazaki .............. F02D 41/1454
 701/114
2012/0310850 A1* 12/2012 Zeng ........................ G06N 5/02
 705/317

FOREIGN PATENT DOCUMENTS

| CN | 102419593 | | 4/2012 |
|----|-----------|----|--------|
| EP | 0351833 | A2 | 1/1990 |
| EP | 0446036 | A2 | 9/1991 |
| EP | 0351833 | B1 | 6/1996 |
| EP | 2472440 | A1 | 7/2012 |
| EP | 2472440 | B1 | 6/2014 |

* cited by examiner

DIAGNOSIS FACILITY AND DIAGNOSTIC METHOD FOR MONITORING PERFORMANCE OF A TECHNICAL PLANT

BACKGROUND OF THE INVENTION

1. Filed of the Invention

The invention relates to a diagnosis facility and a diagnostic method for monitoring the performance of a technical plant with an automation system.

2. Description of the Related Art

Maintenance and servicing of automation technology equipment can be improved if the correct function of subsystems of components is monitored. In the event of decreased functionality, action can be taken at the correct place in the plant in a targeted manner with measures for maintenance, servicing, or correcting a fault.

The paper "Monitoring of Complex Industrial Processes based on Self-Organising Maps and Watershed Transformations" by Christian W. Frey, Fraunhofer Institute IOSB, 11.03.2016, discloses a diagnostic method for monitoring complex industrial processes, in which method a self-organizing map is trained for a fault-free performance of the process via process variables, i.e., using the acquired values for measured values and the values for the controlling variables that have been transmitted to the process. According to the Wikipedia entry, accessed on Apr. 3, 2016, the term "self-organizing maps", Kohonen maps or Kohonen networks (after Teuvo Kohonen; English self-organizing map, SOM or self-organizing feature map, SOFM) denotes a type of artificial neuron networks. As an unsupervised learning method, they are a powerful data-mining tool. Their functional principle is based on the biological finding that many structures in the brain have a linear or planar topology. Using the self-organizing map predetermined according to the above paper, the subsequent operational performance is compared with the learned fault-free performance. In this way, any divergent performance, which can be subsequently analyzed for causes and possible faults in the performance of the process, can be detected.

However, the disadvantage in the conventional diagnostic method is that the time response of a process that is running on a technical plant, which could possibly likewise supply helpful information for a diagnosis, is not taken into consideration.

SUMMARY OF THE INVENTION

In view of the foregoing, it is therefore an object of invention to solve the problem of creating a diagnosis facility and a diagnostic method for monitoring the performance of a technical plant, in which information about the time response is included in the monitoring.

This and other objects and advantages are achieved in accordance with the invention by a diagnosis facility, a diagnostic method, a computer program for performing the diagnostic method, and an appropriate computer program product advantageously having a high level of flexibility and a particular amount of simplicity, where a self-organizing map is learned and parameterized from previously run fault-free continuous step sequences, with time-related fluctuations in the map being represented. Both time-related under- and overrunning are taken into account automatically. Even a case where there are execution times for individual steps that vary in length, that is therefore, both long and short execution times, but not execution times the duration of which lies between these extremes and which nevertheless experience fault-free cycles, is represented by the self-organizing map. In this way, the diagnostic possibilities are consequently further improved.

Advantageously, the diagnostic method in accordance with the invention is applicable to almost all processing, manufacturing and process technology facilities, because technical processes are usually controlled by step sequences, which are also known as sequence chains or sequence controls. The duration of the individual steps can be subject to both production-related and fault-related fluctuations. The time-monitoring of the steps is helpful in detecting deviations since these can already be considered as indicators of faults.

In principle, the duration of an individual step in a step sequence could be monitored by comparing it with a maximum permissible duration. A solution could likewise be found by monitoring a minimum duration. These procedures would be very inflexible, however, because, for example, fluctuations in production that affect a plurality of steps in a step sequence can, disadvantageously, only be taken into account with difficulty and can hardly be detected. On the other hand, the flexibility and reliability of the diagnostic report is considerably better with the diagnosis in accordance with the invention.

The great flexibility of the diagnosis and its simple application are achieved by the fact that, in an automatic learning process for each node of the self-organizing map, which represents a fault-free cycle in the step sequence, an n-tuple with n-coordinates is automatically determined, with each coordinate standing for the duration of the execution of a continuous step running during the learning process. Therefore, the initial values used in the learning of the self-organizing map are the durations of the individual steps in a step sequence. The cycle times for various cycles can vary, even if no fault occurs. As a result, the times of a plurality of cycles in the step sequences that went well are used as training data for the learning of the self-organizing map. During learning, the self-organizing map stores typical running times for the individual steps on each node. At the start of the learning process, a map of the 8×12 nodes size can be used, for example. It should be understood it also possible to use sizes that deviate therefrom. After the learning process, the training data can be used to check the size of the map. If the map is too large, then the individual nodes in the map cannot lead to a hit or can only lead once to a hit for the training data. If a map has proved to be too big, then in a subsequent learning process, a somewhat smaller map size could be selected and the learning process started afresh. Advantageously, the new type of diagnosis consequently hardly requires the operator to have any knowledge of the plant that is to be monitored and is universally applicable in practice. If, in the diagnostic operation, the execution times for individual steps in a cycle that is to be checked differ too much from the self-organizing map previously learned on the node, then this indicates a fault in the plant that is being monitored. More precise knowledge of each process running on the plant being monitored may possibly only be required for the subsequent analysis of the cause of a fault.

By evaluating a data set using the execution times of each step for a cycle that is to be checked via the self-organizing map, deviations in the time response in the cycle that is to be checked from execution times that have been previously learned and stored in the pre-established self-organizing map of fault-free cycles are detected and displayed via of the self-organizing map. Preferably the minimum Cartesian distance between the data set for the cycle that is to be checked and the node of the self-organizing map is determined to detect a deviation in the time response. The node in the map that comprises the smallest Cartesian distance from the data set in the cycle that is to be checked is identified as the "winner" node.

In accordance with a particularly preferred embodiment of the invention, a deviation from the normal performance in the cycle of the step sequence that is to be checked is displayed as a diagnostic statement if the distance from the winner node exceeds a predetermined threshold value. Similarly to the learning of the nodes on the self-organizing map, the threshold values can be determined automatically from the data sets for fault-free cycles. In addition, the respective winner nodes can be determined from the data sets and the respective Cartesian distances between the data sets and the respective winner node can be defined. As a threshold value, the resulting respective distance from its winner nodes can be calculated and predetermined in this way for each respective data set, each increased by a safety margin of, for example, from 5 to 50%, preferably 15% to avoid faulty diagnoses.

In principle, the predetermination of the nodes of the self-organizing map could ensue in any manner, for example, by manual input of the execution times by an operator. Advantageously, however, a simple to execute learning process can be used to predetermine the self-organizing map, which process does not require any complicated inputs from an operator and hardly any knowledge of the performance of the plant. In addition, prior to the cycle that is to be checked, a plurality of data sets that characterize a fault-free performance of the plant are stored in the memory and, using these data sets, the n-tuple with the time responses for fault-free cycles is calculated by the learning process for the nodes of the map and stored thereon, i.e., stored such that the n-tuple is assigned to the node. The map that has been predetermined in this way can be used directly to evaluate a cycle that is to be checked. However, it is still possible for corrections to individual data in the map to be performed by an operator.

The new type of diagnosis is applicable even when forks occur in a step sequence, due to which alternative steps in the step sequence are performed for different cycles. It would be possible in principle to define a self-organizing map for each of the alternative pathways that are taken for cycles and use it in the diagnosis for the subsequent evaluation. This additional effort can advantageously be avoided by setting up coordinates of the n-tuple for all the possibly executable steps, even for those that do not occur in all the cycles. In a cycle that is to be checked for unperformed steps, i.e., steps that have not been performed, the value "zero" is defined as the time response and stored for the coordinate of the data set that has been provided for the step that has not yet been performed.

It is even possible to monitor step sequences with loops, due to which steps of the step sequences in a cycle can be performed a plurality of times. When setting up and learning the self-organizing map using fault-free cycles, a coordinate of the n-tuple is established for each execution of a step of the step sequence in a cycle, and indeed, in steps that occur in a loop, a coordinate is established for every new loop cycle. If a loop is completed less often in a cycle that is to be checked, then the value "zero" is stored in each case on the coordinates of the loop steps that have not yet been completed. Advantageously, this type of monitoring can also find practical use in situations in which the duration of the execution of a step depends on the number of loop cycles that have been carried out beforehand. In practice, it is also possible, in fact, for the subsequent steps to be likewise influenced by the number of loop cycles. Consequently, this action can likewise be monitored using self-organizing maps. From the training data, i.e., from the data sets for fault-free cycles that were used to learn the self-organizing map, it is moreover possible for the maximum occurring number of fault-free cycles in the loop cycles to be determined. If this maximum number is exceeded later during the subsequent monitoring of the plant, this likewise points to a possible fault occurring in the plant. If, on the other hand, the maximum number of cycles is not achieved during the monitoring procedure, then on the coordinates that are assigned to the steps that have not yet been completed, the value "zero" is set for the duration of the execution of the respective step.

In an automated environment, the diagnosis facility can be advantageously configured as a functional component of software, which is connectable in a graphics user interface of an engineering system with functional components of automation programs and is loadable to operate the diagnosis facility in an automation device, for example. Deviations in execution times for individual steps that are then detected and which indicate a fault in the plant are displayed on a "faceplate" for implementing a human-machine interface on an operating and observation device of the automation technology plant. On this operating and observation system, changes to the self-organizing map or to the threshold values that have been assigned to the individual nodes, indicating deviation-sensitivity as it were, can be effected by an operator if so desired.

In a particularly advantageous manner, the diagnosis facility in accordance with the invention, in particular the memory and the evaluation unit, can be used to monitor the performance of a technical plant in a software environment for cloud-based monitoring of the plant. Such a software environment is, for example, the data-based Remote Service "Control Performance Analytics" from Siemens AG. Data from clients' facilities are collected with the aid of software agents, aggregated, and sent to a Siemens Service Operation Center, where they are stored on a Remote Service computer. There they are evaluated semi-automatically with the aid of various "Data Analytics" Software Applications. When required, experts specially trained on this database can work in a highly efficient manner for this Remote Service. The results of the data analysis can be displayed on a monitor on the Remote Service computer and/or can be provided on a Sharepoint so that they can be reviewed by the end client, i.e., the operator of the technical plant, in a browser, for example.

Consequently, the diagnostic method is preferably implemented in software or in a software/hardware combination, such that the invention also relates to a computer program with program instructions executable by a computer for the implementation of the diagnostic method. In this context, the invention likewise relates to a computer program product, in particular a data carrier or a storage medium with a computer program that can be executed by a computer. Such a computer program can, as described in the aforementioned, be stored in a memory of an automation device or loaded therein, such that when operating the automation device, monitoring of the performance of the technical plant is performed automatically, or the computer program can be stored for cloud-based monitoring of a technical plant in a memory of a Remote-Service computer or be loadable therein.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention, together with variants and advantages thereof, will be explained hereinafter with the aid of the drawing, in which an embodiment of the invention is shown, in which.

DETAILED DESCRIPTION OF THE EXEMPLARY EMBODIMENTS

Figure 1:
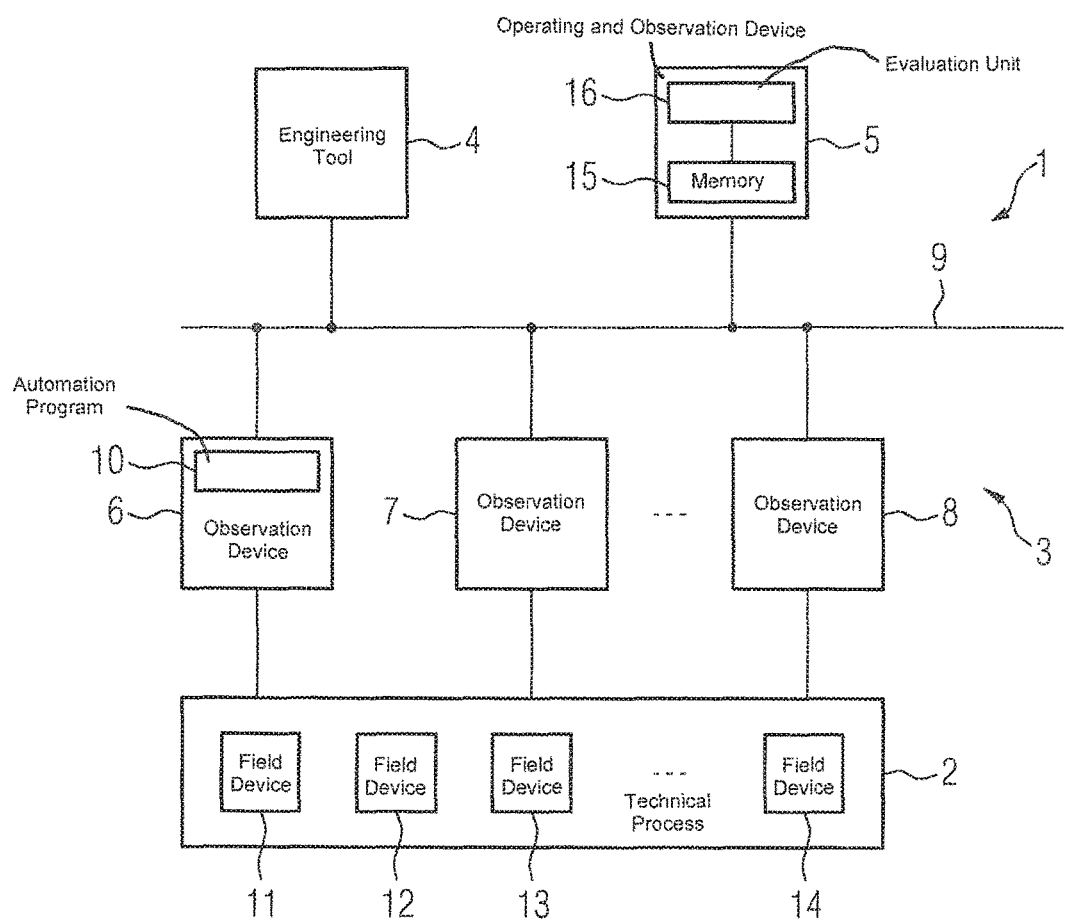
FIG. 1 an example of a technical plant.

FIG. 1 shows, by way of example, in a simplified diagram form, a process technology plant 1, in which a process 2 is controlled via an automation system 3. The automation system 3 contains a planning and engineering tool 4, an operating and observation device 5 and a plurality of observation devices 6, 7, 8, which are connected via a bus system 9 for data communication with one another. The automation devices 6, 7, 8 control the technical process 2 according to automation programs, an example of which is illustrated in FIG. 1 as an automation program 10. The automation program 10 consists, for example, mostly of a plurality of functional components, which can be in interaction with further functional components distributed through the automation system 3. To control the process 2, a wide range of field devices 11, 12, 13, 14 are used for process instrumentation. Transducers are used to determine process variables, such as temperature, pressure, flow volume, filling level, density or gas concentration of a medium. Using actuators, the process sequence can be influenced accordingly as a function of process variables that have been determined, for example, as a function of the specifications set in the automation program 10. A control valve, a heater, or a pump constitute examples of actuators. To monitor the performance of the plant 1, a plurality of data sets that are characteristic of the performance of the plant are acquired and stored in a memory 15. With an evaluation unit 16, the data sets that contain execution times of individual steps in step sequences are evaluated to determine a diagnostic report and display it to an operator, so that suitable measures may possibly be taken to deal with the fault.

In the technical plant 1, technical sequences are controlled by step sequences, which can also be described as sequence cascades. A step sequence represents a running order of processing or production steps, which is stored, for example, in an automation program. The duration of the individual steps can be subject to both production-related and fault-related variations. The time-monitoring of the steps is helpful for detecting deviations and faults.

A step sequence that is described hereinafter by way of example begins according to FIG. 2 with a step 20, which is labeled with the word "START". Steps that do not have any relevance to the understanding of the present invention have not been labeled in FIG. 2. In step 21, which bears the inscription "Fill reactor", a reactor is filled and its content is subsequently mixed by an agitator. At the same time, the reactor is heated according to step 22, which bears the inscription "Heat". Different fill quantities can occur in the reactor. Consequently, the agitator speed is selected variably according to the fill level. The step sequence therefore comprises a fork 23 leading to two alternative paths. If the fill level is less than half, then a condition 24 with the inscription "L_reactor<0.5" is satisfied, and the agitator is operated at 50% of its speed in step 25 with the inscription "Agitator 50%". Where the fill level is above this value, on the other hand, a condition 26 with the inscription "L_reactor>0.5" is satisfied, and the operating speed of the agitator is 100%, according to step 27, which bears the inscription "Agitator 100%". Both alternative paths lead to the aforementioned step 22 with the inscription "Heat". If the nominal temperature is reached, then the product is ready and can be decanted into a tank downstream. A condition 28 is therefore checked with the inscription "T>T_nominal value" and only when it is satisfied does the process move on to the subsequent step 29 with the inscription "agitator & heater off". In a request 30, there is a check to ensure that the components are switched off. The request 30 consequently bears the inscription "is off". There follows step 31 with the inscription "Decant into tank", in which the product is decanted into the tank downstream. Steps 21 to 31 are repeated until the desired volume of the product is in the tank. If therefore, according to a condition 32 with the inscription "L_Tank<L_nominal value", the fill level of the tank is lower than the nominal fill level, then the loop is completed once again. On the other hand, if the fill level of the tank exceeds this limiting value according to a condition 33 with the inscription "L_Tank>L_nominal value", then the loop comes to an end, and the process moves on to a final step 34 with the inscription "END" and the step sequence is terminated.

A problem that occurs in real operation is, for example, fouling, i.e., scale deposits on the inner walls of a heat exchanger that is used for heating. More serious fouling manifests itself in a less effective heat transfer and hence with a lengthening of the duration of the implementation of step 22, which represents the heating process. However, because additionally, the fill level of the reactor can vary in the various cycles of the aforementioned loop, the duration of the heat-up phase varies considerably anyway between the various cycles of the loop. Merely monitoring the duration of the execution of step 22 and comparing it with a fixed limiting value would therefore be less suitable and could only lead to a diagnostic report of low significance. According to the new diagnostic method, on the other hand, different threshold values are advantageously calculated automatically for each loop cycle, and through the evaluation of these values, a considerably more reliable diagnostic report can be obtained.

Figure 2:
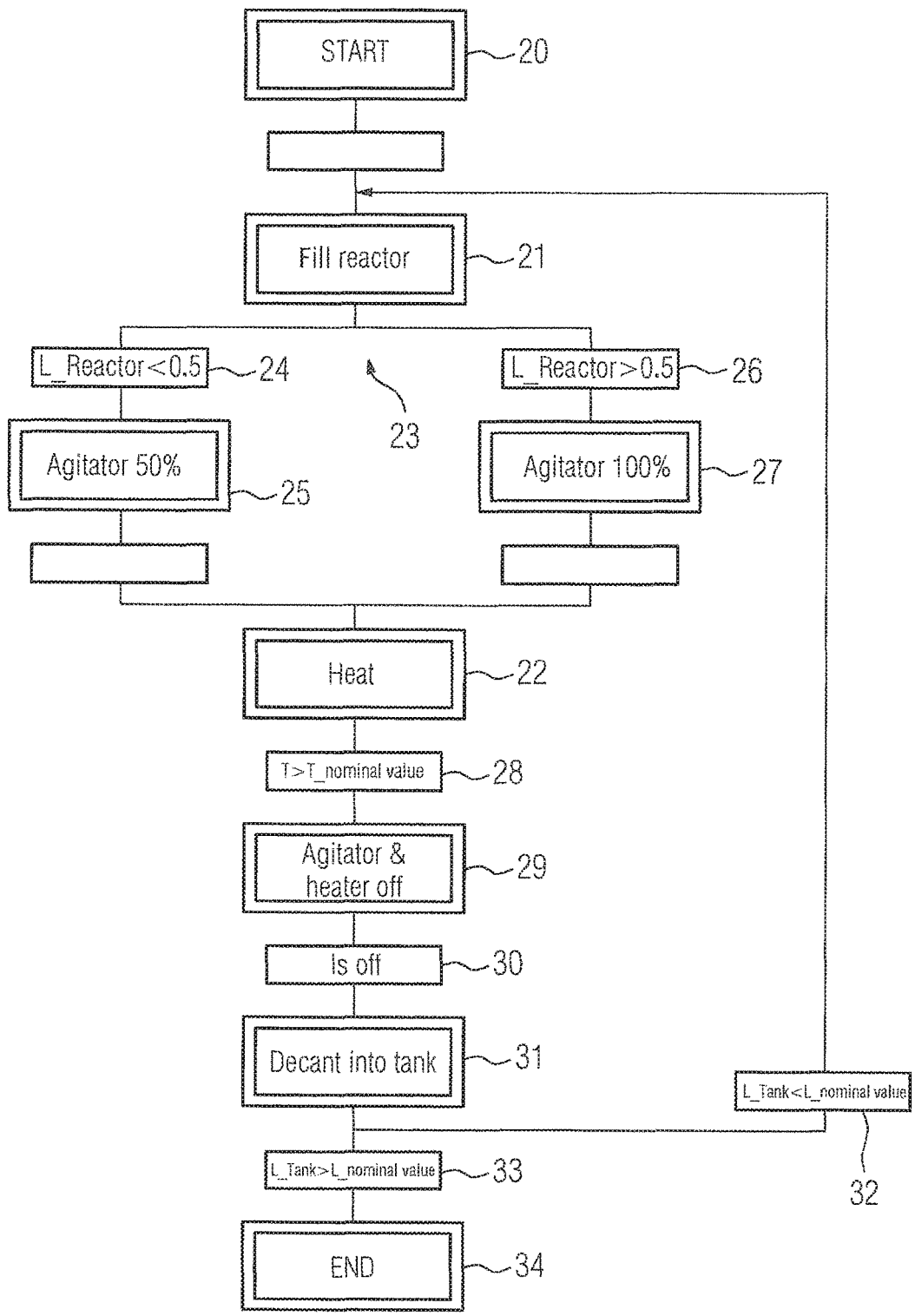
FIG. 2 an example of a step sequence in accordance with the invention.

The monitoring of the durations required to perform individual steps, of for example, the step sequence shown in FIG. 2, is now solved generically using a self-organizing map. Consequently, the durations of the individual steps for cycles of a step sequence are used as data sets that characterize the performance of the plant. For learning the self-organizing map, the times for a plurality of successfully completed cycles in the step sequences are used as training data. After learning, a self-organizing map is obtained, comprising on each node data sets in the form of n-tuples, where each coordinate of the n-tuple represents the execution time of a step in a fault-free cycle. A map of the size 8×12 nodes can be used for the start of the learning process. After learning, the training data can be used to check the size of the map. If the map is too big, then many nodes in the map cannot lead to a hit or can only lead once to a hit for the training data. If a map is too big, then a somewhat smaller map size is selected for the further learning process and this map is learned afresh using the training data.

In a further step, threshold values that are used to detect a deviation from normal performance in a cycle that is to be checked are derived automatically by evaluating data sets for fault-free cycles. In addition, the respective winner nodes are determined with the data sets and the maximum Cartesian distances from them are defined. As a threshold value, the maximum distance is then increased in each case by a safety margin which can amount, for example, to between 5 and 50%, preferably 15%. When such a threshold value is exceeded in the later performance of the plant, the diagnostic report is received, stating that there is a deviation of the data set for a cycle that is to be checked by the self-organizing map that has been learned, which possibly indicates a fault in the plant.

If there are forks in step sequences, such as, for example, the fork 23 shown in FIG. 2, then the steps in the data set that have not been performed due to said fork are likewise taken into account in the data set of a cycle that is to be checked, and to be precise, simply by assigning the value "zero" to the steps unperformed, i.e., the steps that have not been carried out for the duration of the execution thereof. This has the advantage that when monitoring a plant with the aid of a self-organizing map, it is now also possible to monitor in a practical manner application scenarios in which the durations of individual steps that are located within loops depend on the number of loop cycles that have already been completed. Furthermore, this procedure makes it possible to handle a scenario in which the duration of the execution of steps downstream from the loop are influenced by the number of loop cycles that have previously been completed. Even such an action can be taken into consideration by using a self-organizing map. From the training data, i.e., the data sets for previously acquired and saved fault-free cycles, which are used to learn the self-organizing map, the maximum number of cycles in a loop is determined. If a step is run a plurality of times due to a loop, then the durations of the performance of the step are learned for each cycle. The durations for steps of the n-tuple of the self-organizing map that have not been run, up to the learned maximum number, are set at the value "zero" by analogy with the procedure for forks.

In principle, instead of the value "zero", other values can also be set for steps that have not been performed. The value "zero" is characterized, however, by a particularly high level of plausibility for the user of the diagnosis.

During the operation of the plant, cycles of step sequences that are to be checked to monitor the plant are evaluated using the previously learned self-organizing map. For each cycle that is to be checked, the durations of the performance of the individual steps are defined, stored in a memory, and evaluated using an evaluation unit. The evaluation defines the node of the self-organizing map that comprises the smallest Cartesian distance from the data set of the respective cycle that is to be checked. The distance is compared with a predetermined threshold value that is assigned to the respective node. If the threshold value is exceeded, there is then a deviation from the normal performance of the operation of the plant, the cause of which may be a fault in the plant. On an operating and observation device (5 in FIG. 1), for example, this is displayed as a diagnostic report, such that an operator can arrange a further diagnosis or perform appropriate maintenance procedures.

By comparing the execution times for each step in a cycle that is to be checked with the execution times of fault-free cycles stored as coordinates of the n-tuple on the nodes of the self-organizing map, it is possible to determine which individual steps are particularly aberrant and have caused the diagnosis-relevant deviation. An operator of the plant or maintenance personnel can likewise be informed thereof with the aid of an alarm or of an appropriate graphic display.

Figure 3:
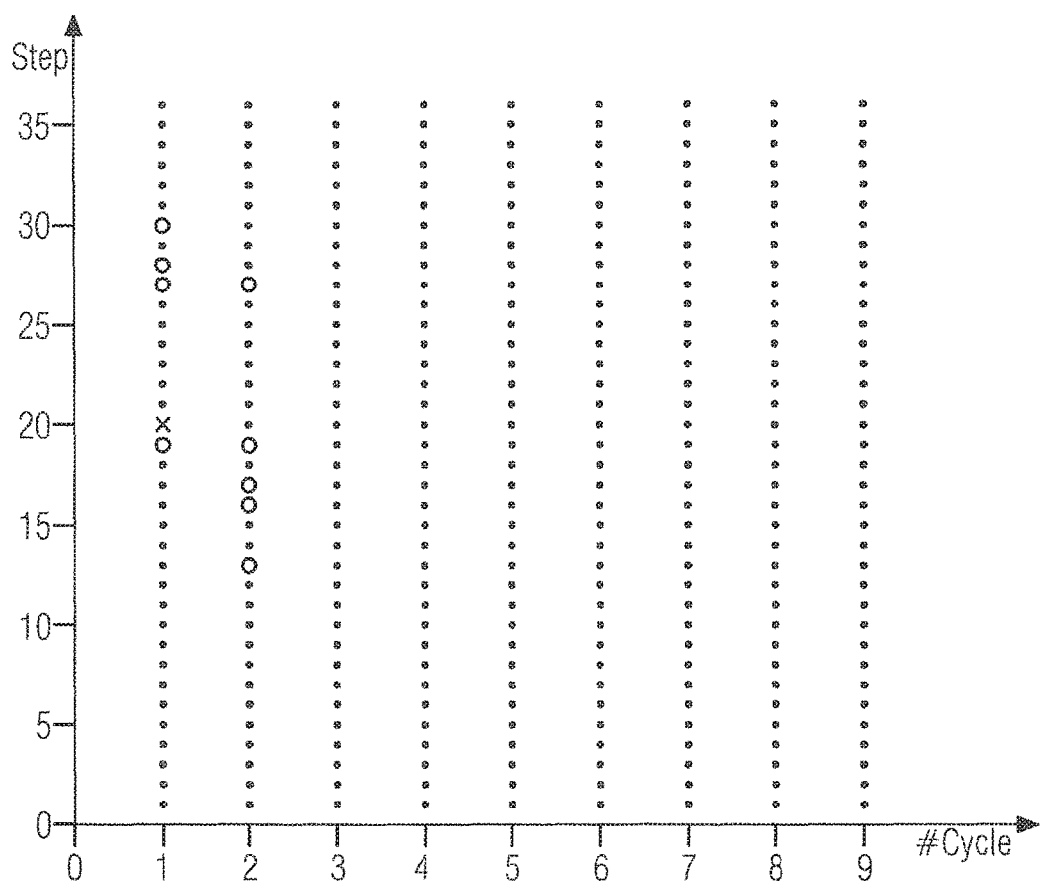
FIG. 3 a chart showing the results of the evaluation of various cycles that have been checked in accordance with the invention.

FIG. 3 shows an example of a chart, in which the results of monitoring the performance of a technical plant can be presented to an operator. Nine cycles in a step sequence are checked in succession. Each number of the cycle checked is shown on the x-axis, which is labeled "#Cycle". The ordinate, which is labeled "Step", shows for every fifth step the number of the respective step in a step sequence with 36 steps. A dot drawn in the diagram indicates that the duration of the execution of the respective step does not comprise any unauthorized deviations from a fault-free cycle. A cross, drawn as an "x", stands for a step duration that is longer than for a fault-free duration, and a circle represents a shorter one. Due to support from the aforementioned diagnosis, it is now easy for an operator to detect that in the first two cycles only, which are shown on the abscissa by the consecutive numbers 1 and 2, deviations have occurred, which may possibly indicate a fault in the plant. In cycle number 1, the execution times for steps 19, 27, 28 and 30 are unusually short, but conversely the duration for step 20 is unusually long. In cycle number 2, the execution times for steps 13, 16, 17, 19 and 27 are unusually short. Due to these indications, the operator can now arrange a more extensive diagnosis in order to detect the cause of fault more precisely.

Figure 4:
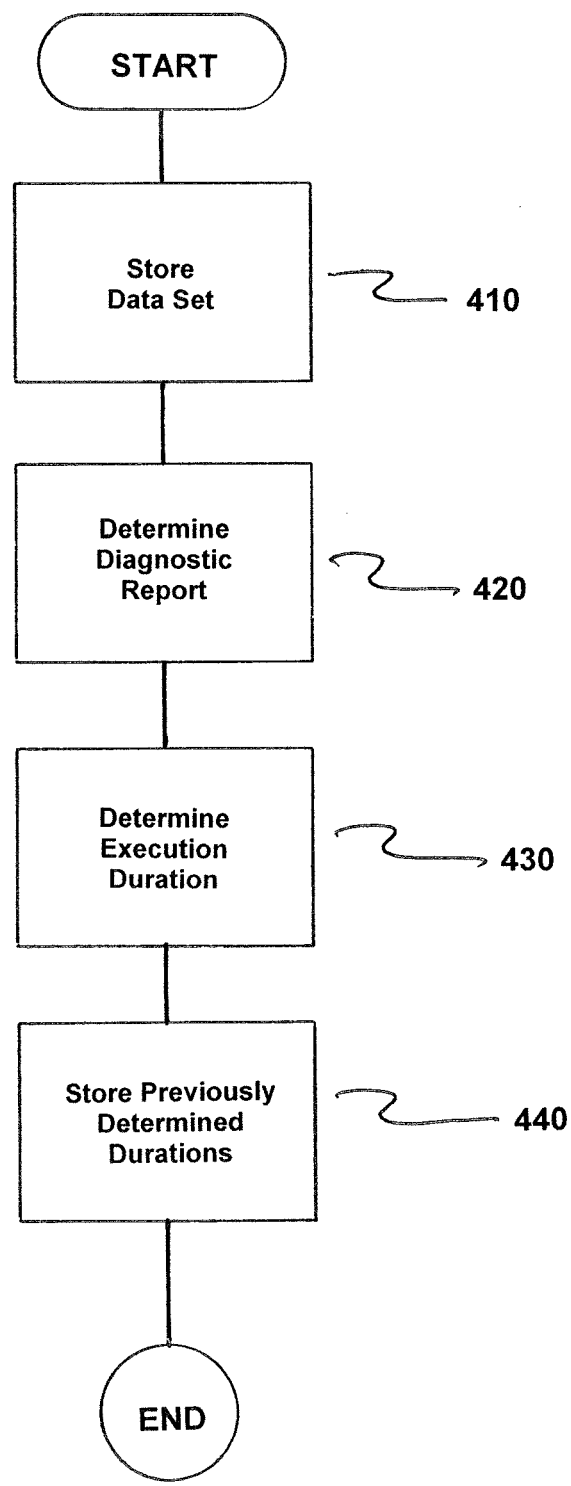
FIG. 4 is a flowchart of the method in accordance with the invention.

FIG. 4 is a flowchart of a diagnostic method for monitoring the performance of a technical plant (1). The method comprises storing at least one data set characterizing performance of the technical plant (1) in a memory (15), as indicated in step 410.

Next, a diagnostic report on the performance of the technical plant is determined using the at least one data set and a predetermined self-organizing map, as indicated in step 420. Next, a duration of the execution of each step of a cycle that is to be checked in a step sequence is determined during the performance of the technical plant with repeatedly run step sequences, as indicated in step 430.

Next, previously determined durations are stored as a respective coordinate of the at least one data set during the performance of the technical plant with the repeatedly run step sequences, as indicated in step 440. Here, the at least one data set comprises an n-tuple with a predetermined number n of coordinates.

Detecting and displaying deviations of a time response in the cycle that is to be checked from fault-free cycles by evaluating the at least one data set during the performance of the technical plant with the repeatedly run step sequences, using the self-organizing map, as indicated in step 450. In accordance with the invention, n-tuples with the predetermined time responses for fault-free cycles of the step sequence are stored on the node of the self-organizing map.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A diagnosis facility for monitoring performance of a technical plant with an automation system, comprising:
   a memory in which at least one data set characterizing the performance of the technical plant is storable; and
   an evaluation unit via which a diagnostic report on the performance of the technical plant is at least one of (i) determinable and (ii) displayable using the at least data set and a predetermined self-organizing map;
   wherein the evaluation unit is configured to determine, by during the performance of the technical plant comprising step sequences that run repeatedly, a duration of an execution of each step of a cycle that is to be checked in a step sequence and to store said duration as a coordinate of the at least data set, the at least data set comprising an n-tuple having a predetermined number n of coordinates;
   wherein the evaluation unit is further configured to detect and display a deviation of a time response in the cycle of the step sequence that is to be checked from a time response for fault-free cycles by evaluating the at least data set, using the self-organizing map; and
   wherein corresponding n-tuples with predetermined durations for fault-free runs of the step sequence are stored on nodes of the self-organizing map.

2. The diagnosis facility as claimed in claim 1, wherein the evaluation unit is further configured to determine a minimum Cartesian distance between the at least data set for the cycle that is to be checked and the nodes of the self-organizing map to detect a deviation in the time response.

3. The diagnosis facility as claimed in claim 2, wherein the evaluation unit is further configured to display, as a diagnostic report, a deviation from the normal performance in the cycle that is to be checked in the step sequence when the Cartesian distance exceeds a predetermined threshold value.

4. The diagnosis facility as claimed in claim 1, wherein the evaluation unit is further configured in order to predetermine the self-organizing map, to store in the memory, prior to a cycle that is to be checked, a plurality of data sets that characterize a fault-free performance of the plant, and utilized said plurality of data sets to calculate for the nodes, via a learning method, the n-tuples with durations of the execution of the steps for fault-free cycles and store said calculated n tuples on the nodes of the self-organizing map.

5. The diagnosis facility as claimed in claim 4, wherein the evaluation unit is further configured, prior to a cycle that is to be re-checked, to store in the memory further data sets that characterize a fault-free performance of the plant, to determine a winner node for respective data sets, to calculate respective maximum distances between the further data sets and the winner node assigned thereto, and to store these, case increased by an added margin to avoid faulty diagnoses, as predetermined threshold values, each assigned to the winner node.

6. The diagnosis facility as claimed in claim 1, wherein the evaluation unit is further configured, at a fork in a step sequence, due to which alternative steps of a step sequence are performable during a cycle, to set a value to "zero" as a duration for unperformed steps in a cycle that is to be checked and store said value for a data set coordinate provided for the unperformed step.

7. The diagnosis facility as claimed in claim 1, wherein the evaluation unit is further configured, at a loop in a step sequence, due to which steps in a step sequence are performable a plurality of times in a cycle, during a learning of the self-organizing map using fault-free cycles for each execution of steps of a step sequence in a cycle, to set a coordinate of the n-tuple and to set a value "zero" as a duration of unperformed loop steps in a cycle of a sequence of steps that is to be checked and store said value for a coordinate of a data set that is assigned to an unperformed loop step.

8. The diagnosis facility as claimed in claim 1, wherein at least the memory and the evaluation unit are implemented by software on a Remote Service computer for remote diagnosis of the technical plant.

9. A diagnostic method for monitoring the performance of a technical plant, comprising:
   storing at least one data set characterizing performance of the technical plant in a memory;
   determining a diagnostic report on the performance of the technical plant using the at least one data set and a predetermined self-organizing map;
   determining a duration of the execution of each step of a cycle that is to be checked in a step sequence during the performance of the technical plant with repeatedly run step sequences;
   storing previously determined durations as a respective coordinate of the at least one data set during the performance of the technical plant with the repeatedly run step sequences, the at least one data set comprising an n-tuple with a predetermined number n of coordinates; and
   detecting and displaying deviations of a time response in the cycle that is to be checked from fault-free cycles by evaluating the at least one data set during the performance of the technical plant with the repeatedly run step sequences, using the self-organizing map, n-tuples with the predetermined time responses for fault-free cycles of the step sequence being stored on the node of the self-organizing map.

10. A non-transitory computer-readable medium encoded with a computer program executed by a computer that causes monitoring performance of a technical plant, comprising:
   program code for storing at least one data set characterizing performance of the technical plant in a memory;
   program code for determining a diagnostic report on the performance of the technical plant using the at least one data set and a predetermined self-organizing map;
   program code for determining a duration of the execution of each step of a cycle that is to be checked in a step sequence during the performance of the technical plant with repeatedly run step sequences;
   program code for storing previously determined durations as a respective coordinate of the at least one data set during the performance of the technical plant with the repeatedly run step sequences, the at least one data set comprising an n-tuple with a predetermined number n of coordinates; and program code for detecting and displaying deviations of a time response in the cycle that is to be checked from fault-free cycles by evaluating the at least one data set during the performance of the technical plant with the repeatedly run step sequences, using the self-organizing map, n-tuples with the predetermined time responses for fault-free cycles of the step sequence being stored on the node of the self-organizing map.

11. The non-transitory computer-readable medium of claim 10, wherein the computer program product comprises a storage medium.

* * * * *